(12) United States Patent
Patapoutian et al.

(10) Patent No.: US 11,757,472 B1
(45) Date of Patent: Sep. 12, 2023

(54) COARSE INTERLEAVING (71) Applicant: Seagate Technology LLC, Fremont, CA (US)

(72) Inventors: Ara Patapoutian, Rancho Santa Fe, CA (US); Jason Charles Jury, Apple Valley, MN (US); Deepak Sridhara, Longmont, CO (US); Jason Bellorado, San Jose, CA (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/744,874

(22) Filed: May 16, 2022

(51) Int. Cl.
| | |
|---|---|
| *H03M 13/00* | (2006.01) |
| *H03M 13/27* | (2006.01) |
| *G06F 7/78* | (2006.01) |
| *H03M 13/05* | (2006.01) |

(52) U.S. Cl.
CPC .......... *H03M 13/2778* (2013.01); *G06F 7/78* (2013.01); *H03M 13/05* (2013.01)

(58) Field of Classification Search
CPC .. H03M 13/09; H03M 13/2778; H03M 13/05; G06F 7/78
See application file for complete search history.

(56) References Cited

U.S. PATENT DOCUMENTS

| | | | |
|---|---|---|---|
| 4,964,094 A * | 10/1990 | Satoh ................. | G11B 27/3027 |
| 5,517,631 A | 5/1996 | Machado et al. | |
| 6,487,293 B2 * | 11/2002 | Sako ...................... | H04N 5/913 |
| | | | 713/193 |
| 6,661,591 B1 | 12/2003 | Rothberg | |
| 6,661,758 B2 * | 12/2003 | Sako .................. | G11B 20/1866 |
| | | | 369/53.15 |
| 7,110,199 B2 * | 9/2006 | Sugawara .......... | G11B 20/1426 |
| | | | 360/48 |
| 7,552,280 B1 | 6/2009 | Naamad et al. | |
| 8,023,217 B1 * | 9/2011 | Pinvidic ................ | G06F 3/0676 |
| | | | 360/51 |
| 8,627,179 B1 | 1/2014 | Wu et al. | |
| 9,158,617 B2 * | 10/2015 | Cho ....................... | H03M 13/09 |
| 9,208,083 B2 | 12/2015 | Han et al. | |
| 9,281,009 B1 | 3/2016 | Burton et al. | |
| 9,419,952 B2 | 8/2016 | Urzi et al. | |
| 2008/0163028 A1 * | 7/2008 | Mokhlesi ............ | G06F 11/1072 |
| | | | 714/763 |
| 2008/0225431 A1 | 9/2008 | Craig et al. | |
| 2009/0150744 A1 * | 6/2009 | Flynn ........................ | G06F 9/52 |
| | | | 714/752 |
| 2009/0307434 A1 | 12/2009 | Sivaramakrishnan et al. | |
| 2014/0201590 A1 | 7/2014 | Coker et al. | |
| 2015/0161045 A1 | 6/2015 | Zuo et al. | |

FOREIGN PATENT DOCUMENTS

EP   0 907 257 A2   4/1999

* cited by examiner

*Primary Examiner* — Esaw T Abraham
(74) *Attorney, Agent, or Firm* — Westman, Champlin & Koehler, P.A.

(57) ABSTRACT

A method includes encoding a sector of data to be written to a data storage device with a single error correcting code (ECC). The sector of data is divided into N individually readable and writeable portions, with N≥2. The individually readable and writeable portions of the sector of data are separated with a space between the portions of the sector of data in a pattern.

13 Claims, 5 Drawing Sheets

FIG. 8

COARSE INTERLEAVING

SUMMARY

In one embodiment, a method includes encoding a sector of data to be written to a data storage device with a single error correcting code (ECC). The sector of data is divided into N individually readable and writeable portions, with N≥2. The individually readable and writeable portions of the sector of data are separated with a space.

In another embodiment, a system includes a data storage device to receive a piece of data to be stored, and a controller. The controller is configured to encode a sector of data to be written to the data storage device with a single error correcting code (ECC). The controller is further configured to divide the sector of data into N individually readable and writeable portions, with N≥2. The controller is further configured to separate the individually readable and writeable portions of the sector of data with a space between the portions of the sector of data in a pattern.

In another embodiment, a method includes encoding each sector of data of a plurality of sectors of data to be written to a storage drive with its own single error correcting code (ECC). Each sector of data of the plurality of sectors of data is divided into N equal size individually readable and writeable portions, with N≥2. The divided individually readable and writeable portions of each of the sectors are interleaved with a space between the individually readable and writeable portions of the sector on a single track in a pattern chosen to have uniform latency for adjacent sector reads.

Other features and benefits that characterize embodiments of the disclosure will be apparent upon reading the following detailed description and review of the associated drawings.

DETAILED DESCRIPTION OF ILLUSTRATIVE EMBODIMENTS

In a hard disc drive (HDD), proximate positions on a given track are correlated in signal to noise ratio (SNR). A local impairment therefore usually degrades SNR of a whole sector, leading to increased likelihood of sector failure. Several approaches to alleviating this issue have been used, with each having negatives. One approach is to interleave sectors in the media such that a local impairment is distributed among multiple sectors. This approach requires a read-modify-write operation. Another approach is to encode a sector with a single error correcting code (ECC) and distribute it on two adjacent tracks. This approach has concerns with skew issues, write performance, and implementation with two-dimensional magnetic recording (TDMR). Yet another approach is to encode a sector with a single ECC and distribute it on two different surfaces. This approach has concerns with impairment correlation in track misregistration (TMR) and the availability of dual channels.

In the first approach discussed above, with interleaved sectors, a fraction of a host sector (typically 4 kilobytes (kB)) cannot be written. There is a mapping of multiple host sectors written to a single media sector that is larger than a host sector, such as 32 kB. Even if it is distributed on the media sector, the media sector and all intervening sectors are read to retrieve their data, then modified to accommodate the new write, new ECC is computed, and then all host sectors are rewritten. This is referred to as read-modify-write, and is very time consuming for writing a single media sector. Suppose eight 4 kB host sectors are interleaved onto a 32 kB media sector, and one of the eight 4 kB host sectors is to be rewritten. In this instance, each of the eight host sectors on the media sector is read, modification is done on the host sector to be written, and all eight host sectors are re-written to the media sector.

In the second approach, two adjacent tracks are written for separate sections of a sector of data. With such an approach, two writers and two readers are used. With two writers, skew issues arise when a read/write head moves from an inner diameter (ID) to an outer diameter (OD) of an HDD. The head may be aligned tangential to a track at a middle diameter (MD), but is skewed at the ID or OD. With two readers/writers, and a fixed relative position of head separation, alignment becomes an issue. This is especially true with variable tracks per inch (TPI) approaches that are commonly used in HDDs. Alternatively, with data recorded in two passes and read back in two passes, a large performance penalty is present.

In the third approach, data from a sector is divided and written to two separate platters of an HDD. Since different heads seek/read/write on different platters, the issues with skew are reduced in such an approach. However, TMR issues related to external vibrations will affect the whole HDD at the same time, and so writing to different platters, while physically separating the data, does not account for a single vibration affecting both heads at the same time. Further, even though writing and reading of data may be done in parallel, the processing of that data is not done in parallel when there is only one data processing unit, which is common. To process in parallel would use additional channels adding additional costs.

Space diversity approaches that avoid the issues discussed above are provided by embodiments of the present disclosure. In actual operating conditions, only a few locations on tracks of an HDD have quality issues. In most areas of an HDD, a suitable margin is present to allow for recovering a sector written on media of the HDD. Certain locations, such as tracks squeezed or otherwise impinged on by/from adjacent tracks, or areas being written when a vibration such as an external vibration occurs, tend to result in most failures. Space diversity, such as is provided in embodiments of the present disclosure, diversify data within the HDD, so even if a small amount of data is compromised, the whole sector is not. ECC code for the sector can be used to reconstruct bad data more easily when it is diversified over space.

Embodiments of the present disclosure generally provide an interleaving process for data of a sector of data to be written to an HDD. In one approach, a sector of data is encoded with a single ECC for the entire sector, and is divided into at least two portions. Then, a space is introduced between the split portions of the sector on a track of the HDD. While this introduces a small latency, the interleaving, as well as some specific order of sector portions within the interleaving, provides benefits including not having a read-write-modify configuration for data of different sectors (as each split portion of a sector is written with its unique preamble field), no sector size change, and no read head additions or multiple channels. In one embodiment, each sector is split into two sections, and a number of split sectors are interleaved within a track. With ordering of the sector sections, a read/write of two consecutive sectors introduces a small amount of latency, but allows for a net increased areal density (ADC).

Figure 1:
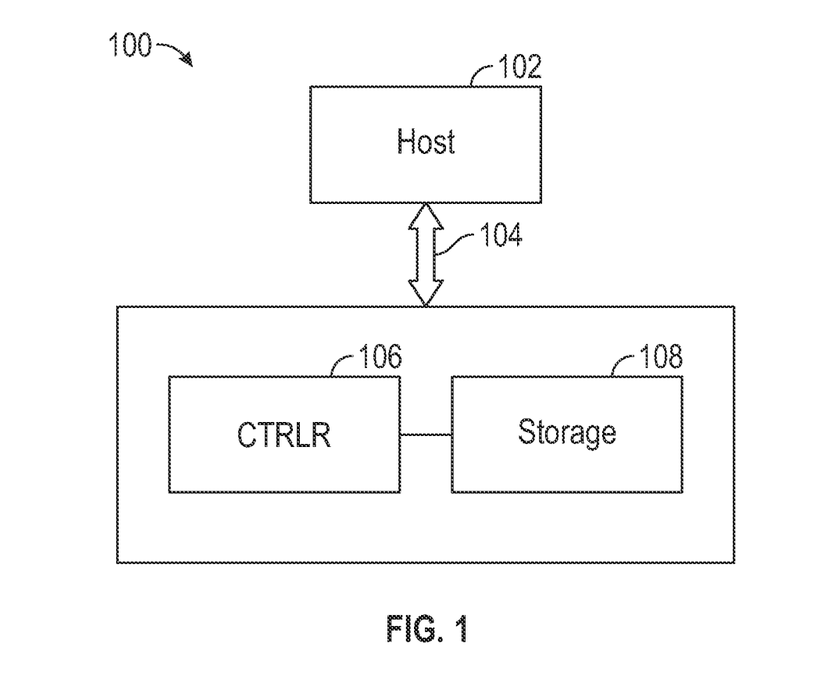
FIG. 1 is a block diagram of a representative system on which embodiments of the present disclosure may be practiced.

Prior to providing a detailed description of the different embodiments, one example of an illustrative operating environment in which certain specific embodiments disclosed herein may be incorporated is shown in FIG. 1. The operating environment shown in FIG. 1 is for illustration purposes only. Embodiments of the present disclosure are not limited to any particular operating environment such as the operating environment shown in FIG. 1. Embodiments of the present disclosure are illustratively practiced within any number of different types of operating environments.

It should be noted that the same or like reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It will be understood that, when an element is referred to as being "connected," "coupled," or "attached" to another element, it can be directly connected, coupled, or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled, or attached to each other.

FIG. 1 is a diagrammatic illustration of a system in which data interleaving is carried out in accordance with certain embodiments of the present disclosure. Specifically, FIG. 1 provides a simplified block diagram of a data storage device (DSD) 100. The DSD 100 may be coupled to a host 102 and may service commands from the host 102. The host 102 may also be referred to as the host system, host device or host computer. The host 102 can be a desktop computer, a laptop computer, a server, a tablet computer, a telephone, a music player, another electronic device, or any combination thereof. The DSD 100 can communicate with the host device 102 via a hardware or firmware-based interface 104. The interface 104 may comprise any interface that allows communication between a host 102 and a DSD 100, either wired or wireless, such as NVMe (non-volatile memory express), SCSI (small computer system interface), SAS (serial attached SCSI), FC-AL (fiber channel arbitrated loop), PCI-E (peripheral component interconnect express), IDE (integrated drive electronics), AT (advanced technology), ATA (advanced technology attachment), SATA (serial advanced technology attachment), eSATA (external SATA), PATA (parallel ATA), PCIe (peripheral component interconnect express), IEEE (institute of electrical and electronics engineers)-1394, USB (universal serial bus), compact flash, Ethernet, Thunderbolt, or other interface connector adapted for connection to a host computer. The interface 104 may include a connector (not shown) that allows the DSD 100 to be physically removed from the host 102.

DSD 100 can include a programmable controller 106 and main storage 108. Programmable controller 106 can include associated memory and one or more processors. The main storage 108 can be arranged as one or more rotatable recording discs to provide a main data storage space.

Figure 2:
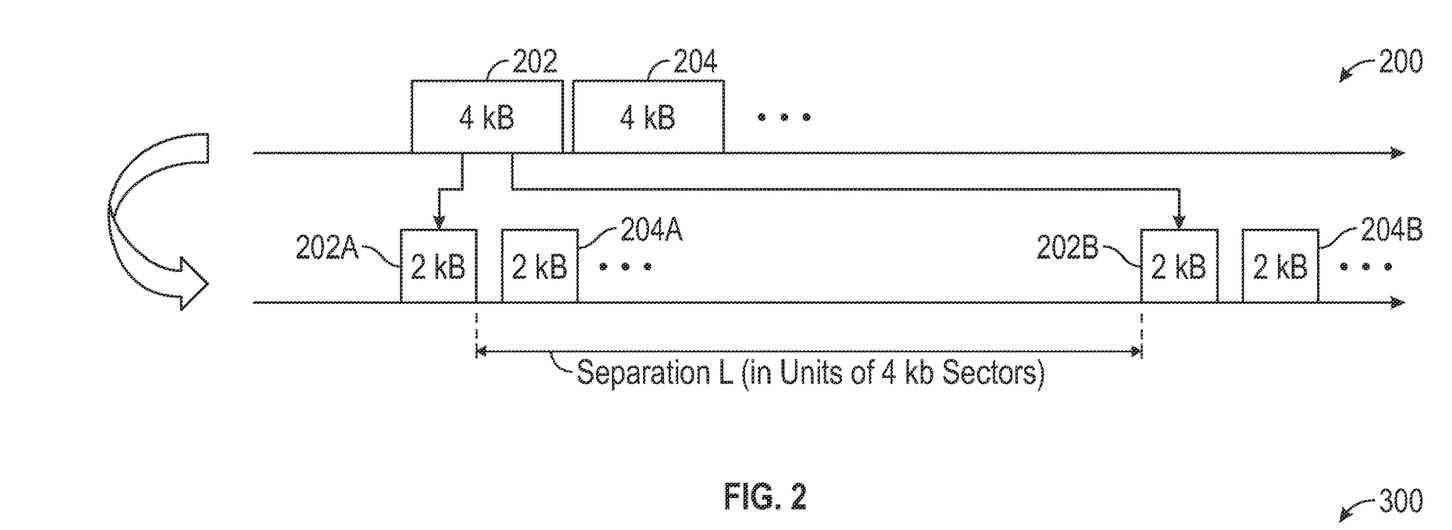
FIG. 2 is a diagram of coarse interleaving according to an embodiment of the present disclosure.

FIG. 2 is a diagram of a basic coarse interleaving configuration 200 according to an embodiment of the present disclosure. In FIG. 2, a first sector of data 202 and a second sector of data 204 are to be written to a HDD. In this FIG. 2, each sector is a 4 kB sector, although the sector size may be different without departing from the scope of the disclosure. In this configuration, sector 202 is broken into two portions 202A and 202B, each of 2 kB size. Sector 204 is broken into two portions 204A and 204B, each of 2 kB size. In this approach, a sector (e.g., sector 202 or 204) is provided from a host as a complete sector encoded with a single ECC.

A space, L, for example in units of sector size (e.g., 4 kB in this example) is introduced between portions of a sector on a track of the HDD. For writing, portion 202A is written, then portion 204A, . . . , until all sectors to be written have their first portions written. Then the second portions 202B, 204B, . . . are written. The separation, L, between portions of a sector may be chosen based on predetermined criteria, such as latency and operational speed. In one example, the separation can be L=3 sectors.

While each sector 202 and 204 is shown as being broken into two equal portions, it should be understood that the sector may be broken into more equal size portions, such as 4, 5, or more, without departing from the scope of the disclosure.

When broken into portions, the encoding does not change. instead, the sector is simply broken into portions for writing. Each portion of a sector is provided with its own preamble. Preambles are known, and contain metadata including by way of example only, one or more of an address mark detection including a special sequence of bits to allow a timing lock via a phase locked loop (PLL), a guard band for separation of sectors, and the like. The addition of a preamble to each portion of a sector does add some small amount of overhead. With current HDD settings, this additional format cost is in one embodiment about 0.5%. Format loss may be reduced with further configuration of the preamble. Also, areal density may be increased since space diversity allows the placement of bits and/or tracks closer together.

Writing in the fashion shown in FIG. 2 does not affect the host in any way. All splitting and space diversity writing and reading of sector data is performed in the HDD, by a controller or other control logic as is discussed further herein.

Figure 3:
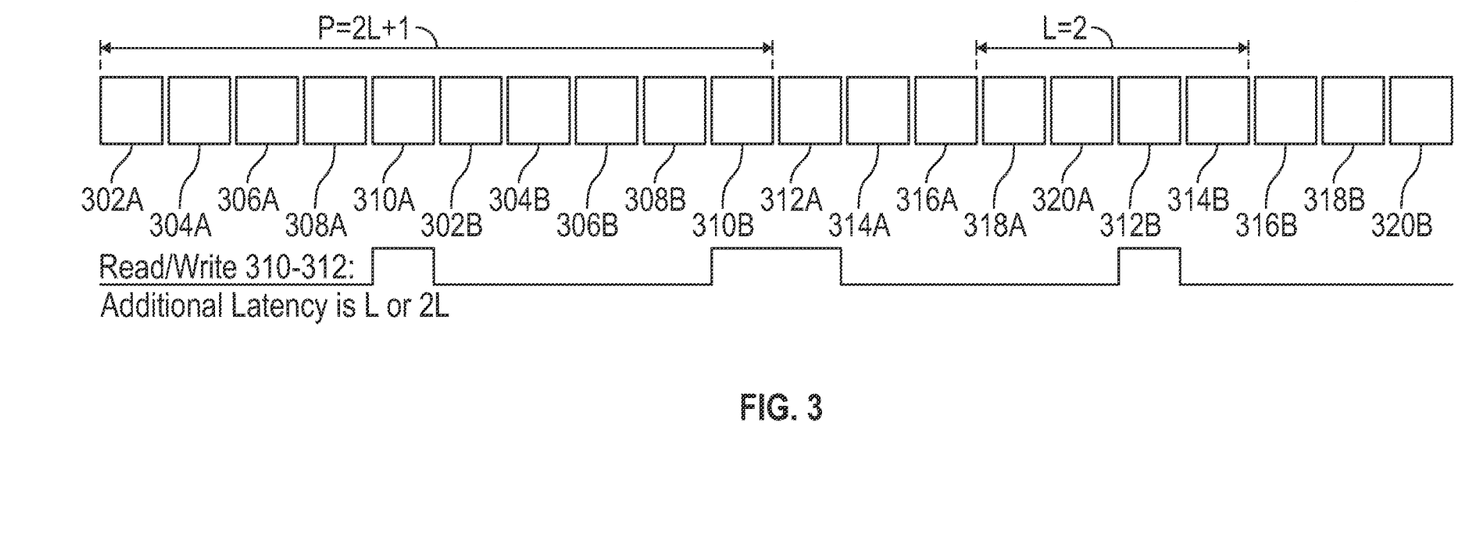
FIG. 3 is a diagram of an interleaved format according to an embodiment of the present disclosure.

Layouts of portions of sectors may be done in a pattern. FIG. 3 shows a format layout 300 according to an embodiment of the present disclosure. In FIG. 3, ten sectors are shown, each broken into two portions, so that there are a plurality of first portions and a plurality of second portions. The first and second portions are 302A and 302B of a first sector, 304A and 304B of a second sector, 306A and 306B of a third sector, 308A and 308B of a fourth sector, 310A and 310B of a fifth sector, 312A and 312B of a sixth sector, 314A and 314B of a seventh sector, 316A and 316B of an eight sector, 318A and 318B of a ninth sector, and 320A and 320B of a tenth sector. In this example, the sectors are 4 kB in size, and the portions are each 2 kB in size.

For example, a pattern is formed by interleaving a number of sectors of data each divided into two portions, and arranged in an order with the first portion of each of the sectors of data written consecutively followed by the second portion of each of the sectors of data written consecutively. In this arrangement, a first half of the sectors are written with their first portions written consecutively, followed by their second portions consecutively. That is, portions 302A, 304A, 306A, 308A, and 310A are written, followed by portions 302B, 304B, 306B, 308B, and 310B. Then portions 312A, 314A, 316A, 318A, and 320A are written, followed by portions 312B, 314B, 316B, 318B, and 320B.

In this configuration, latency on a read is determined by an amount of delay in reading a sector or sectors. For each individual sector, a latency read is L. L in this configuration is two sectors in length (four sector portions). For reading all sectors, there is no latency. For reading consecutive sectors, the latency depends on which sectors are to be read. Reading sectors 302 and 304, latency is ¾ L. That is, 302A and 304A are read, 306A, 308A, and 310A are skipped, and 302B and 304B are read. Reading sectors 310 and 312 introduces the most latency. 310A is read, and 302B, 304B, 306B, and 308B are skipped (L latency). 310B and 312A are read, and 314A, 316A, 318A, and 320A are skipped (L latency), and then 312B is read. That is a total latency of 2L, since the reads are occurring from two periods.

From FIG. 3, a period P of length 2L+1 is introduced due to a latency L. This periodicity can make it more challenging to fit an integer number of periods in each track. In one configuration of a HDD, each sector takes about 20 microseconds (μs) of time to move a read/write head. Due to the latency L, a read command takes longer to execute, impacting input/output operations per second (IOPS). However, this is noticeable only under a random-read environment. Even then, the impact is quite small. For example, with L=3, the additional latency is around 60 μs whereas an average command execution is about 5 milliseconds (ms), depending on queue depth, location on disc, etc.) This results in about a 1% loss in random-read IOPS. The latency introduced does not affect operations greatly, and the space diversity introduced more than overcomes the performance loss.

Figure 4:
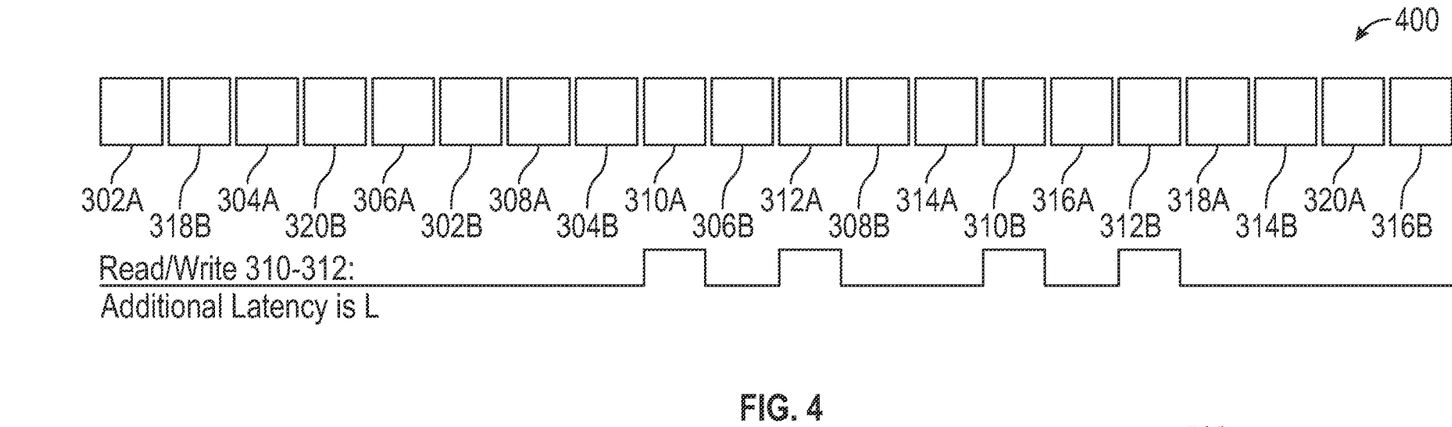
FIG. 4 is a diagram of another interleaved format according to an embodiment of the present disclosure.

To reduce the largest read latency from 2L, and to introduce a uniform latency of L, an alternative format layout 400 is shown in FIG. 4. Layout 400 includes a pattern of portions of sectors that writes all first portions of sectors consecutively, but spaced apart by another portion of the selection of second portions. In this configuration, the order of the second portions is offset by two portions. That is, there are 20 portions in 10 sectors. The first portions are written with the first portion 302A of the plurality of first portions in a first position and consecutively every other portion. The second portions are written starting offset, with the ninth second portion 318B written after the first portion 302A, then the tenth, first, second, . . . second portions consecutively every other portion. This makes the latency equal for all single sector reads, other than a read of all sectors which has no latency. The situation of 2L latency (reading sectors 310 and 312 as in FIG. 3), has latency of L in this configuration. Portion 310A is read, portion 306B is skipped (¼ L), portion 312A is read, portions 308B and 314A are skipped (½ L), portion 310B is read, portion 316A is skipped (¼ L), and portion 312B is read. Every read has a latency of L, since the reads are all in one period.

Figure 5:
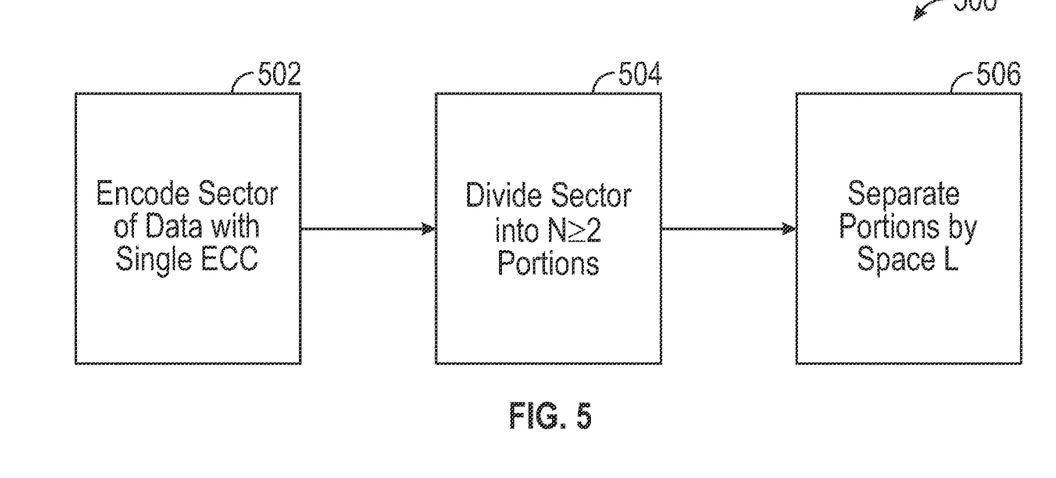
FIG. 5 is a flow chart diagram of a method according to an embodiment of the present disclosure.

A method 500 of interleaving is shown in flow chart form in FIG. 5. Method 500 comprises, in one embodiment, encoding a sector of data to be written to a hard disc drive (HDD) with a single error correcting code (ECC) in block 502. The sector of data is divided into N portions, with N≥2 in block 504. The portions of the sector of data are separated with a space between the portions of the sector of data in a pattern in block 506.

Advantages of the embodiments of the present disclosure over previous attempted solutions include 1) no read-modify-write operation is used since each 4 kB sector can be written and read independent of any other sector; 2) No changing of sector size on the part of a host is used; and 3) no reader additions or multiple channels are used.

Further advantages of the embodiments of the present disclosure include net areal density (ADC) gain, even with format loss (e.g., for extra preamble space). Gains are higher for a high-vibration environment over a low-vibration environment.

A higher ADC gain for high-vibration environments is due to more energy in acoustic mode disturbance in 2-4 kilohertz (kHz) frequency range. The lower ADC gain for low-vibration environments is due to lack of acoustic mode disturbance energy. Nearly all energy is in mechanical mode disturbances which are in 100 s of Hz that use longer interleave periods.

In some instances, an integer number of periods may not exactly fit onto a single track. In those situations, several options may be employed. If, for example, an integer number of periods on a single track is too low in resolution, boundary conditions may apply.

HDD surfaces are divided into different zones. There may be hundreds of zones or more. If the media and the read/write head are good and stable, more closely packed reading/writing may be able to be performed. That is, good read/write heads can place more data on media than bad read/write heads. To have good resolution, such considerations are taken into account. This may be done at manufacture, for example.

If a period for writing/reading is 10, and there are 102 sectors, the number of sectors is not evenly splittable. Ten periods may be used, but there are then two sectors that are outliers. In such boundary conditions, there are options for treatment. in one embodiment, additional sectors are written to and read from an adjacent track. This may lead to larger latency issues.

Bits per inch (BPI) and tracks per inch (TPI) may be adjusted in some situations. BPI and TPI have a relationship.

As BPI increases, TPI usually is decreased. As BPI decreases, TPI usually may be increased. A period depends on a number of sectors being written/read. With a period P having a separation between portions of L, P is larger if an even number of periods are desired in the track. This can affect resolution.

Options for addressing this loss of resolution include increasing TPI. Narrower tracks means more tracks. For example, if 10.3 periods fit on a track, 10 periods may be written, and the margin introduced by that may be used to increase TPI. Another option is to split the data to two adjacent tracks, without using an even number of periods.

Another option is to use more than one period on a track. For example, if a track has N sectors, and two periods P and P', a solution to fit all data onto one track chooses integers n and m such that nP+mP'=N. In a numeric example, suppose there are 102 sectors (N), the sectors may be divided into periods of 10 (P) and 6 (P'). Satisfying the n and m integers results in n=6 (60 sectors) and m=76 (42 sectors). This matches not a single period but multiple periods on a track to match a number of sectors in the track. This weighted sum of two is exactly the number of sectors desired to be written to the track. P and P' can differ by 1 relative to the choice of P to reduce and ADC impact.

Hardware and processes associated with the embodiments is what are typically used for reading and writing, with control logic within a controller or other processor used to implement the methods. In general, the read and write processes involve detectors, decoders, and encoders, in addition to read/write hardware.

Figure 6:
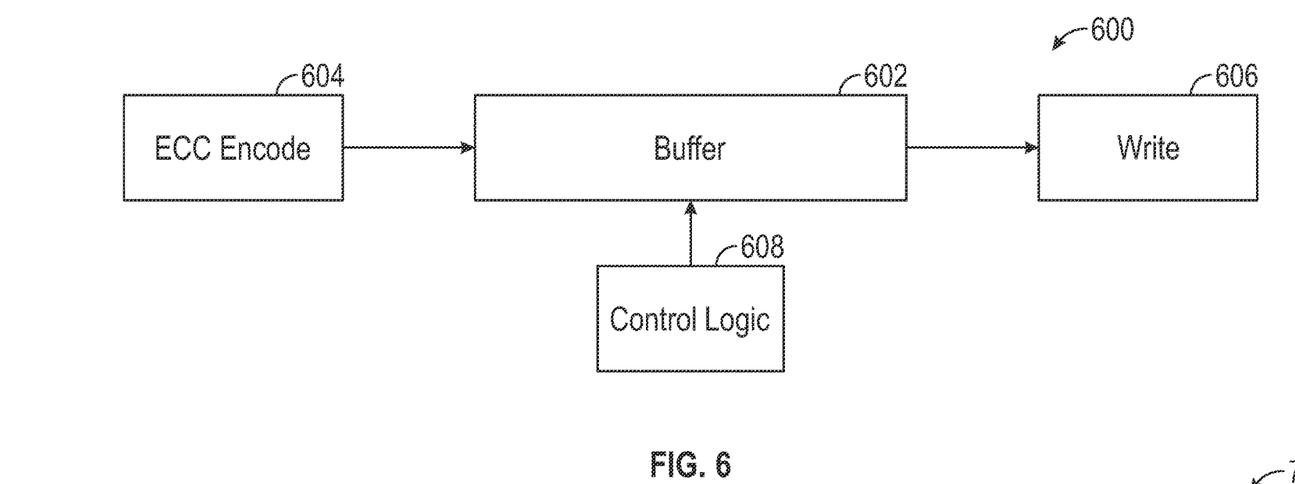
FIG. 6 is a block diagram of components of a representative write process according to an embodiment of the present disclosure.

FIG. 6 illustrates an example write process 600. While the particular process is shown, it should be understood that other write processes will be apparent to those of skill in the art, without departing form the scope of the present disclosure. On the write side, a buffer 602, of size proportional to L, is positioned between an ECC encoder 604 and write circuitry 606. Control logic 608 is included to segment the incoming sector into portions and to record the portions to the media at an appropriate time.

In an example write operation according to an embodiment, a sector to be written is sent from a host. The sector has its ECC determined on a complete sector basis. Once the ECC is determined, the sector is loaded to the buffer 602 according to instructions in the control logic 608. In one example, the sector is split into two portions. The data comes in as a full sector, with ECC. The control logic writes a first half (or other determined portion), and then at a later time and in a different location, writes the second half, using the buffer 602 to assemble all data to be written. Data is written with writer 606 according to instructions form the control logic 608.

Figure 7:
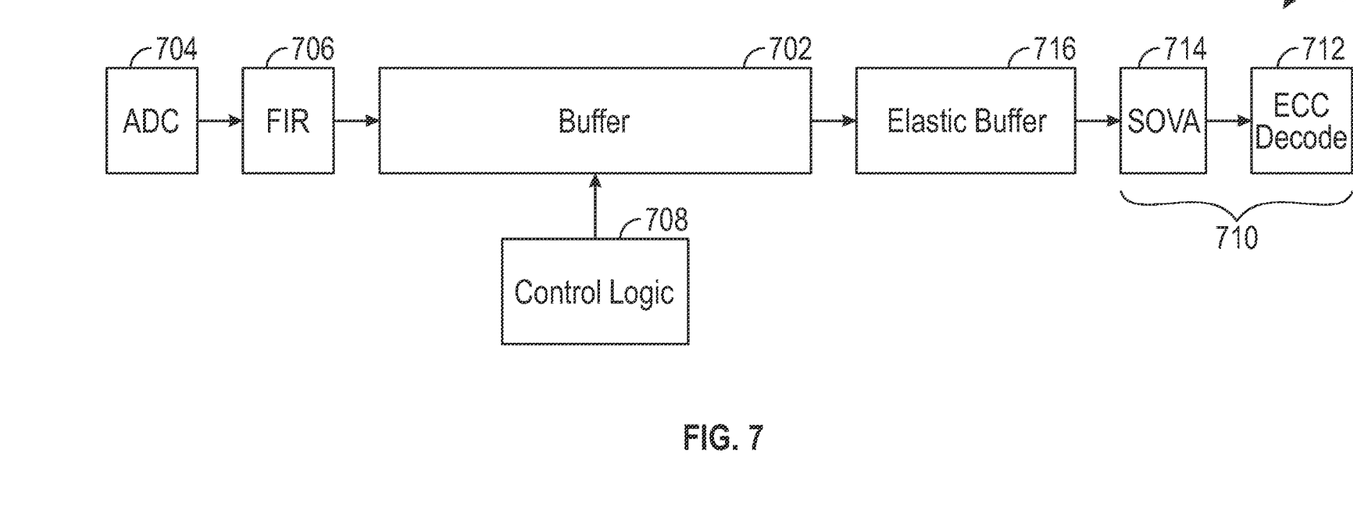
FIG. 7 is a block diagram of components of a representative read process according to an embodiment of the present disclosure.

FIG. 7 illustrates an example read process 700. While the particular process is shown, it should be understood that other read processes will be apparent to those of skill in the art, without departing form the scope of the present disclosure. For a read operation, a buffer 702 of size proportional to L, is placed after an analog to digital converter (ADC) 704 and a finite impulse response filter (FIR) 706 for frequency shaping. The buffer 702, using instructions from control logic 708, bundles sector portions to be read by aligning them in the buffer 702. All data not being read may be skipped. The buffer 702 at this point actually holds data samples rather than bits. The FIR 706 is inserted before the buffer 702 to reduce the latency for adaption. A detector 710 (including ECC decoder 712 and, depending on the type of ECC being used, soft output Viterbi algorithm (SOVA) 714, is inserted after the buffer 702 to allow the detector 710 to detect a whole sector at a time.

In one embodiment, such as using low density parity check codes (LDPC) for ECC, the SOVA 714 and elastic buffer 716 may be used. In general, there is a detector and a decoder. Specific types of ECC have specific elements for detecting and decoding. In LDPC, probabilities are used, so the SOVA 714 is employed. In essence, with LDPC, decode time is variable, as LDPC is an iterative decoding process. Some errors will converge quickly, and others will not. Those errors that do not converge quickly use more iterations. Since read media data does not wait for decoding, in some embodiments an elastic buffer 716 is used. If the buffer 702 is designed to be able to store sufficient data for 10 iterations, and a specific sector uses 30 iterations for decoding, the extra data is moved to the elastic buffer 716. Such a read process, as has been mentioned, is only one read process, and other read processes may be used without departing from the scope of the disclosure.

Figure 8:
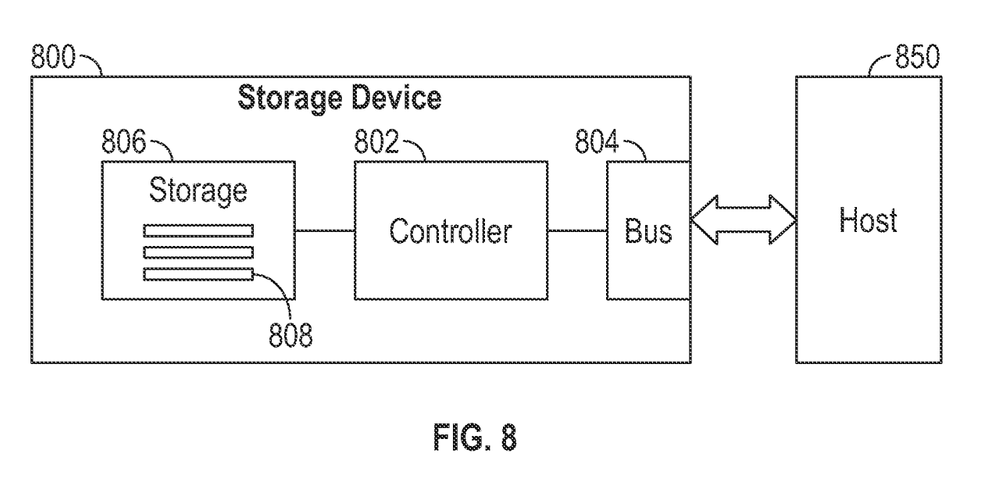
FIG. 8 is a block diagram of a data storage device on which embodiments of the present disclosure may be used.

Referring now to FIG. 8, a simplified block diagram of a storage system 800 in which embodiments of the present disclosure may be practiced is shown. Storage system 800 may be an HDD with a platter or platters 808, a read head, and associated controllers (not shown). System 800 may include, by way of example, a controller 802 couplable via a bus 804 or the like to a host system 850, where the host system 850 may provide power over the bus 804 or through a separate power bus (not shown), and a storage component 806 (such as a spinning disk or platter of disks 808). Controller 802 is configured to carry out interleaving in accordance with one or more of the methods described above. To carry out the interleaving, the controller 802 may execute instructions stored on any tangible computer-readable medium/memory in storage system 800.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method, comprising:
    encoding a sector of data to be written to a data storage device with a single error correcting code (ECC);
    dividing the sector of data into N individually readable and writeable portions, with N≥2; and
    separating the individually readable and writeable portions of the sector of data with a space, wherein separating is performed in a pattern formed by interleaving a number of sectors of data each divided into two portions, and arranged in an order with the first portion of each of the sectors of data written consecutively followed by the second portion of each of the sectors of data written consecutively.

2. The method of claim 1, wherein the portions of the sector of data are written on a single track of the data storage device.

3. The method of claim 1, wherein separating is performed in a pattern formed by interleaving a number of sectors of data each divided into two portions, and arranged in an order with the first portion of each of the sectors of data written consecutively followed by the second portion of each of the sectors of data written consecutively.

4. The method of claim 1, wherein dividing into N portions comprises dividing evenly into N portions.

5. The method of claim 1, wherein dividing into N portions comprises dividing using a first plurality n of sectors having a first period P and a second plurality m of sectors having a second period P'.

6. The method of claim 5, wherein N=nP+mP'.

7. The method of claim 1, wherein the space between the portions of the sector is chosen as a multiple of units of a size equal to a sector size.

8. The method of claim 1, wherein each of the N portions has its own individual preamble metadata.

9. A system, comprising:
    a data storage device to receive a piece of data to be stored; and
    a controller configured to:
    encode a sector of data to be written to the data storage device with a single error correcting code (ECC);
    divide the sector of data into N individually readable and writeable portions, with N≥2; and
    separate the individually readable and writeable portions of the sector of data with a space between the portions of the sector of data in a pattern,
    choose the pattern to have uniform latency for adjacent sector reads, and
    form the pattern by interleaving a number of sectors of data each divided into two portions and arranged in an order with the first portion of each of the sectors of data written in consecutive order alternating with the second portion of each of the sectors of data written in a different order.

10. The system of claim 9, wherein the controller is configured to write the portions of the sector of data on a single track of the data storage device.

11. The system of claim 9, wherein the controller is configured to choose the space between the portions of the sector as a multiple of units of a size equal to a sector size.

12. A method, comprising:
    encoding each sector of data of a plurality of sectors of data to be written to a data storage device with its own single error correcting code (ECC);
    dividing each sector of data of the plurality of sectors of data into N equal size individually readable and writeable portions, with N≥2; and
    interleaving the divided individually readable and writeable portions of each of the sectors with a space between the individually readable and writeable portions of the sector on a single track in a pattern chosen to have uniform latency for all adjacent sector reads.

13. The method of claim 12, wherein the pattern is formed by interleaving the plurality of sectors of data and arranged in an order with the first portion of each of the sectors of data written in consecutive order alternating with the second portion of each of the sectors of data written in a consecutive order offset by a number of portions.

* * * * *